United States Patent [19]

Mele et al.

[11] Patent Number: 5,037,777
[45] Date of Patent: Aug. 6, 1991

[54] METHOD FOR FORMING A MULTI-LAYER SEMICONDUCTOR DEVICE USING SELECTIVE PLANARIZATION

[75] Inventors: Thomas C. Mele; Wayne M. Paulson; Frank K. Baker; Michael P. Woo, all of Austin, Tex.

[73] Assignee: Motorola Inc., Schaumburg, Ill.

[21] Appl. No.: 546,801

[22] Filed: Jul. 2, 1990

[51] Int. Cl.⁵ .......................................... H01L 21/44
[52] U.S. Cl. .................................. 437/195; 437/228; 437/978; 437/982; 437/984; 148/DIG. 133; 148/DIG. 161
[58] Field of Search ............... 437/978, 982, 195, 228, 437/984; 148/DIG. 133, DIG. 161

[56] References Cited

U.S. PATENT DOCUMENTS

| | | | |
|---|---|---|---|
| 4,234,362 | 11/1980 | Riseman | 437/984 |
| 4,707,457 | 11/1987 | Erb | 437/195 |
| 4,906,592 | 3/1990 | Merenda et al. | 437/195 |
| 4,948,743 | 8/1990 | Ozaki | 437/982 |
| 4,997,790 | 3/1991 | Woo et al. | 437/195 |

FOREIGN PATENT DOCUMENTS

| | | | |
|---|---|---|---|
| 0071010 | 2/1983 | European Pat. Off. | 437/982 |
| 0144762 | 6/1985 | European Pat. Off. | |
| 56-083947 | 7/1981 | Japan | 437/982 |
| 58-042254 | 3/1983 | Japan | 437/982 |
| 59-117134 | 7/1984 | Japan | 437/982 |
| 61-54645 | 3/1986 | Japan | 437/195 |
| 63-129649 | 6/1988 | Japan | 437/195 |

Primary Examiner—Brian E. Hearn
Assistant Examiner—Laura M. Holtzman
Attorney, Agent, or Firm—Robert L. King

[57] ABSTRACT

The disclosed invention is a method for fabricating a multi-layer semiconductor device using selective planarization. In accordance with one embodiment of the invention, conductive members are formed on a substrate and a first insulating layer is deposited onto the substrate and the conductive members. A second insulating layer, which has a lower flow temperature than the flow temperature of the first layer, is deposited onto the first layer. A photoresist mask is patterned and developed to form a window which exposes an area between the conductive members. The device is preferentially etched such that only the exposed areas of the second insulating layer are removed, leaving the first insulating layer intact. An anisotropic etch is used to remove portions of the first insulating layer, leaving spacers along the edges of the conductive members. The photoresist mask is removed and a heating step is performed which flows the remaining portions of the second insulating layer, but not the first layer. Since the second insulating material remains in only selective areas, the process is termed selective planarization. The method provides the benefit that areas which are to be etched to form contact hole or vias are not planarized, unlike existing blanket planarization methods, and a self-aligned contact is formed between the conductive members to the substrate.

13 Claims, 6 Drawing Sheets

METHOD FOR FORMING A MULTI-LAYER SEMICONDUCTOR DEVICE USING SELECTIVE PLANARIZATION

BACKGROUND OF THE INVENTION

This invention relates to semiconductor devices in general and more specifically to semiconductor devices having multiple conductive layers.

Semiconductor devices, such as integrated circuits (ICs), are becoming increasingly complex. While the demand requires semiconductor manufacturers to continually improve the power and performance of their devices, demand also requires the devices to be made smaller. A common way to achieve a smaller device is to shrink the dimensions of existing devices. Another widely practiced method of keeping the device size to a minimum is achieved by building the devices in the vertical direction, rather than in the horizontal. This is apparent in today's double-level and even triple-level polysilicon and metallization processes. But with these multi-layered devices came problems with fabrication. Two of the problems which have arisen are 1) being able to isolate one conductive layer from another, and 2) providing a relatively planar surface on which subsequent layers will be deposited and patterned.

With regard to the isolation of conductive layers, insulating layers known as inter-level dielectrics or inter-level oxides were developed and implemented between the conductive layers. Common insulating materials used today include $SiO_2$, $Si_3N_4$, and doped oxides such as PSG (phospho-silicate glass) and BPSG (boron doped phospho-silicate glass). Deposition techniques of such materials include CVD (chemical vapor deposition) using $SiH_4$ or TEOS (tetra-ethyl-ortho-silicate) source gases or using a spin-on-glass (SOG). The problem of planarization has been dealt with in a number of ways, including depositing a very thick insulating layer and etching the layer back until it is relatively planar, flowing a glass layer such that it becomes planar, and the use of SOG, which produces a planar surface at the time of deposition. The planarized layer can subsequently be masked and etched in order to make vias to the desired underlying conductor layer.

But again, demand continues to drive semiconductor manufacturers to reduce the dimensions of their devices further, such that new problems have developed with the aforementioned solutions. For example, since existing planarization methods provide blanket planarization (i.e. the entire surface of the device is planarized), areas which are to be etched to form contact holes or vias have insulation layers which are generally very thick, making it difficult to achieve the desired etch profiles in narrow regions. Alignment sequences also become more difficult as there is little room for alignment error. A misalignment might result in exposing a conductive layer, rather than isolating it. In addition to isolating conductive layers on top of one another, isolation between closely spaced conductive members which are adjacent to each other must also be guaranteed. This poses an even greater challenge since the thickness of the isolation layer needs to be minimized in order to satisfy the demands of smaller devices. Besides being difficult to etch in narrow regions, forming the actual contact becomes more difficult since it is harder to deposit conductive materials in regions with high aspect ratios.

Therefore, a need existed for an improved method of fabricating a semiconductor device, more specifically for a method for fabricating a multi-layer semiconductor device which would enable the isolation of side-by-side conductive members separated by sub-micron spaces and provide a self-aligned contact to a substrate. In addition, a need existed for such method to also provide planarization over selected areas of selected layers of the device.

BRIEF SUMMARY OF THE INVENTION

The disclosed invention is a method for fabricating a multi-layer semiconductor device which provides isolation between fine-pitch conductive members while planarizing selected portions of the device. A preferred embodiment of the invention comprises providing a substrate on which conductive members are formed. A first insulating layer is deposited over the substrate and the conductive members, followed by depositing a second insulating layer on the first insulating layer. The second insulating layer is patterned such that the second insulating layer is removed from the space between the conductive members. The first insulating layer is also patterned to expose an area of the substrate between the conductive members while forming spacers along the edges of the members. Remaining portions of the second insulating layer are heated sufficiently to flow the second insulating layer. A conductive layer is deposited over the remaining portions of insulating layers and the exposed substrate area and is patterned to form a contact to the substrate.

DETAILED DESCRIPTION OF THE INVENTION

Figure 1A:
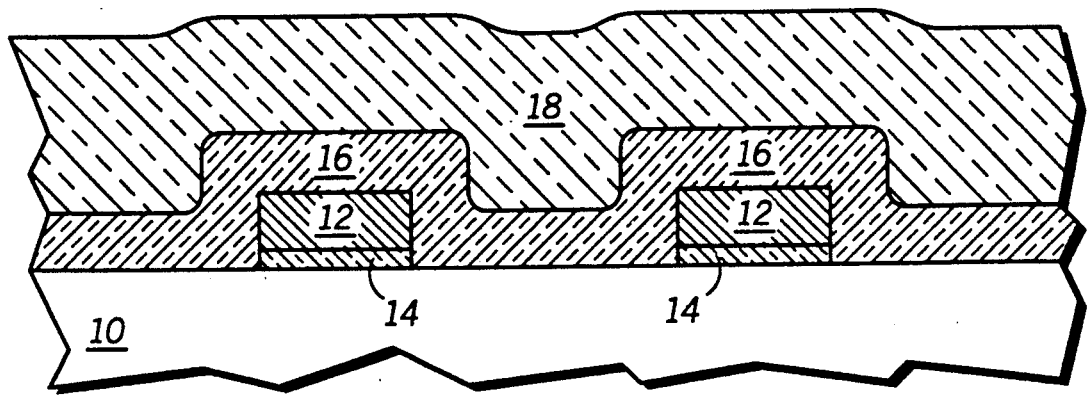
FIGS. 1A–1C: Cross-sectional views of a semiconductor substrate illustrating a prior art method of forming a contact to substrate between two conductive members.
Figure 1B:
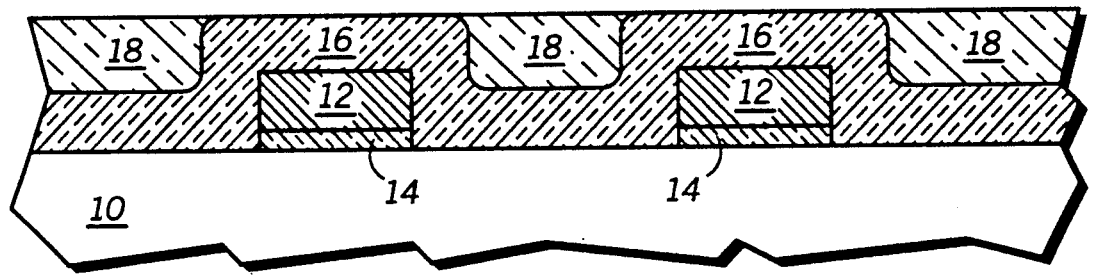

Various planarization methods are commonly used in the manufacturing of semiconductor devices. One method is illustrated in FIG. 1. Conductive members 12 of FIG. 1A are formed on substrate 10, the conductive members 12 and substrate 10 being separated by a gate oxide (or other dielectric material) layer 14. Substrate 10 is generally silicon but may be of another material, such as any of the III-V compounds known in this art. Conductive members 12 can be formed from a number of materials, such as polysilicon, aluminum, aluminum alloys, tungsten, or the like. An insulating layer 16 is formed on the substrate 10 and also on conductive members 12. The insulating layer 16 not only isolates the conductive members from one another, but also isolates the members from subsequent conductive layers which may be added to the device. In FIG. 1A layer 16 is illustrated as being conformal to the underlying topography, however in variations of the prior art processes the layer may or may not be conformal. Insulating materials which are commonly used include $SiO_2$, PSG, BPSG, and the like. A second insulating layer 18 is formed over the first insulating layer 16, layer 18 being relatively planar. The planarity of layer 18 can be achieved in a variety of ways including: 1) forming the second layer 18 such that its thickness is substantially greater than that of the first layer 16; 2) flowing the insulating layer 18 after it is formed; or 3) choosing an insulating material which planarizes as it is deposited, for example SOG. Since having such a thick layer of insulating material is impractical, the device is etched to provide a thinner, more planar surface, as illustrated in FIG. 1B.

In order for subsequent conductive layers to make contact to the substrate 10, a contact hole or via must be made. Typically this is done by a series of conventional photolithography and etch steps. A window 22 of FIG. 1C has been formed in a photoresist layer 20 to expose those areas of the device which are to be etched away (for example the area within the dashed line 24). Upon exposing the device to an etch, area 24 will be removed while the remaining areas will be left unaffected. In this manner, a contact hole or via is formed. A conductive layer is deposited and patterned to form the actual contact.

Figure 1C:
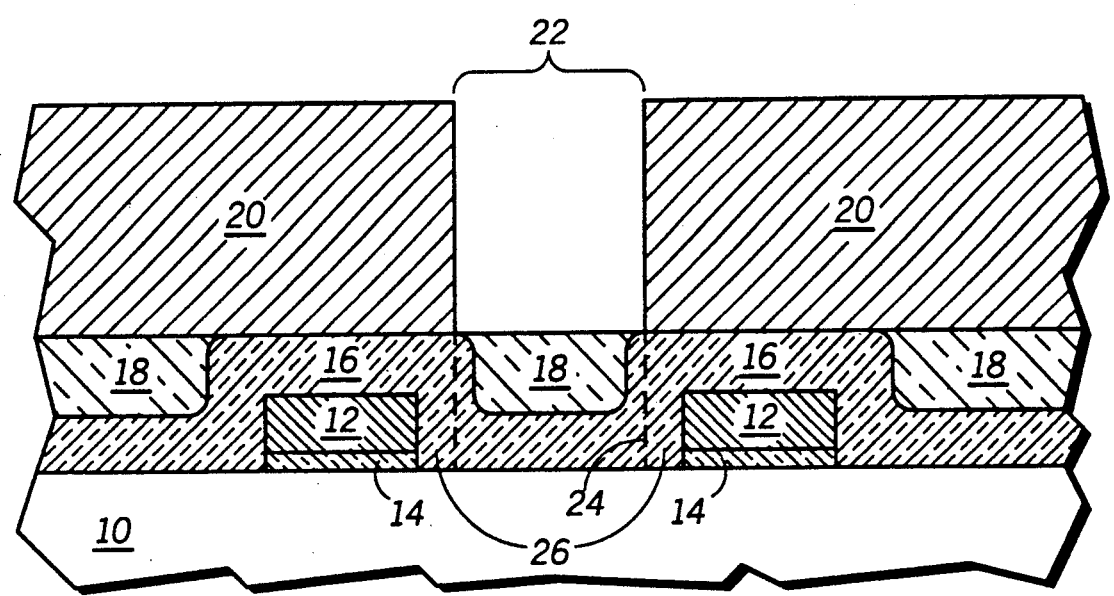

As briefly mentioned earlier, a few problems exist with this and other existing methods of forming a contact to a substrate. One problem, as illustrated in FIG. 1C, is the thickness of the insulating material between the conductive members. It is desirable to etch this material such that the substrate 10 is exposed, yet the insulating material remains along the edges of the conductive members to provide isolation. However, etching vertically through such a thick layer without etching in the horizontal direction as well is not easily done. Another problem is that there is little room for alignment error regarding window 22. Misaligning the window 22 would result in removing undesired portions of the insulating layer 16, thereby exposing a conductive member 12 rather than isolating it.

Figure 2A:
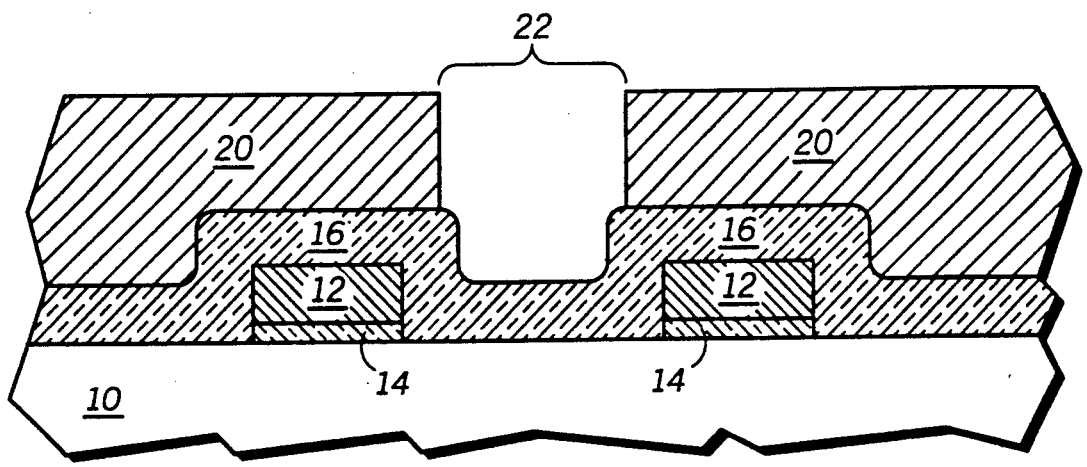
FIGS. 2A–2C: Cross-sectional views of a semiconductor substrate illustrating another prior art method of forming a contact to substrate between two conductive members.
Figure 2B:
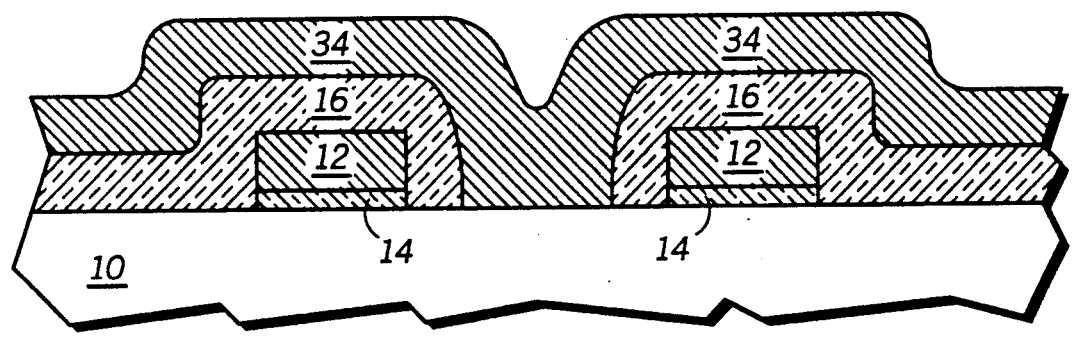
Figure 2C:
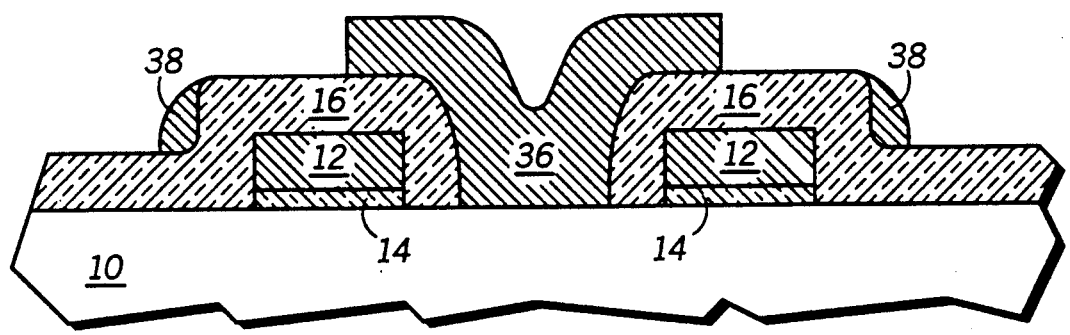

To avoid etching a thick insulating layer, some semiconductor manufacturers choose to deposit only one conformal layer over the conductive members, as illustrated in FIG. 2A. Again, conductive members 12 are formed on substrate 10, the conductive members 12 and substrate 10 being separated by a gate oxide layer 14. An insulating layer 16 is deposited over the conductive members 12 and the substrate 10. At this point, rather than planarizing the surface as in FIG. 1, photoresist 20 is applied and patterned to form the window 22 and the insulating layer 16 is etched. By not applying the second insulating layer which planarizes the surface, the thickness of the insulating material between the conductive members 12 is kept to a minimum, allowing for an easily controlled etch. As in FIG. 2B, a conductive layer 34, such as polysilicon, aluminum, tungsten, or the like, is deposited over the entire surface of the device. Using conventional photolithography and etch sequences, the conductive layer 34 is processed to form a contact 36 as illustrated in FIG. 2C. While this method does eliminate etching a very thick insulating layer, other problems develop. One problem is that conductive stringers 38 may be formed in the corners of the conformal insulating layer. Stringers are residual material which is not removed during the contact etch operation and their presence causes a potential reliability problem. In addition to the problem of stringers, there is also the problem that the areas outside of the conductive members 12 are no longer planar, making it difficult to build successive layers on top of the existing layers.

Perhaps the latest manufacturing equipment is capable of resolving such small geometries, aligning targets within the necessary tolerance level, and achieving the desired etch profiles for today's sub-micron devices; however, many fabrication facilities are required to accomplish these aforementioned tasks using older, existing equipment. Therefore, a method for forming sub-micron contacts using existing processing technology is needed. This need is satisfied with the present invention, which provides a method for forming a self-aligned contact to substrate using a selective planarization process. Although this invention was developed to aid in fabricating sub-micron device, it may also be implemented on devices with larger feature sizes.

Figure 3A:
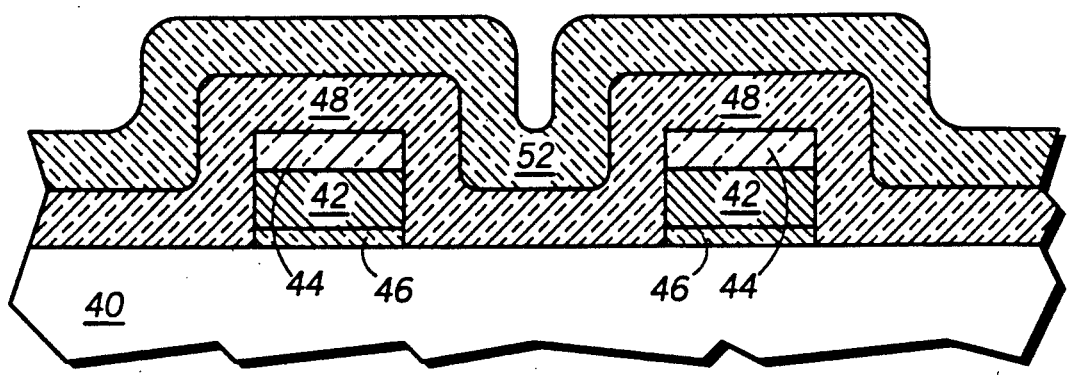
FIGS. 3A–3E: Cross-sectional views of a semiconductor substrate illustrating a preferred embodiment of the disclosed invention.

A preferred embodiment of the invention is illustrated in FIGS. 3A-3E. FIG. 3A illustrates conductive members 42, being made of polysilicon, aluminum alloys, refractory metals, or the like, formed on substrate 40 and being separated from the substrate 40 by gate oxide layer 46. A dielectric layer 44 is formed on the conductive members 42, and an insulating layer 48 is deposited on the substrate 40 as well as on the conductive members 42 and dielectric layer 44. The dielectric layer 44 and first insulating layer 48 can be made of the same material, but are named differently for reasons of distinction. Typically materials for these layers might include any undoped, glass-like substance, such as $SiO_2$, $Si_3N_4$, or the like. While the gate oxide layer 46 thickness is generally quite thin (75-500 Å), the first insulating layer 48 is typically much thicker (500-4,000 Å). A second insulating layer 52 is deposited over the first layer 48, having comparable thickness to the first layer 48. Second layer 52 is also made of a glass-like substance, such as PSG, BPSG, doped $SiO_2$, or the like, but must be able to flow at a temperature below the flow temperature of the first insulating layer 48. By having the second layer doped and the first layer undoped, the second layer is able to flow at a temperature lower than the flow temperature of the first layer. The second insulating layer need not be doped to be considered a part of this invention; for example, doped or undoped SOG could be used as a second layer insulating material.

Figure 3B:
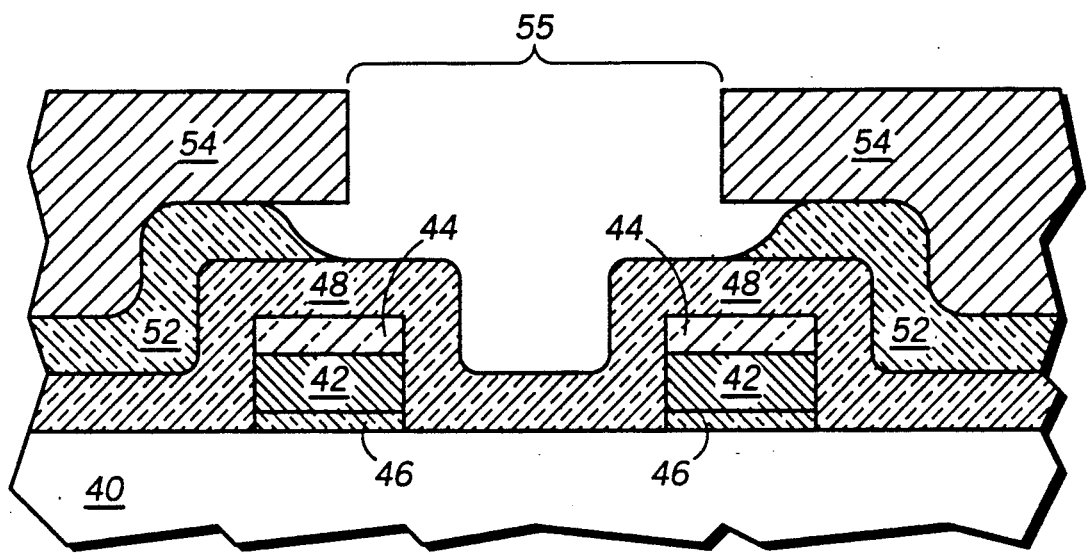
Figure 3C:
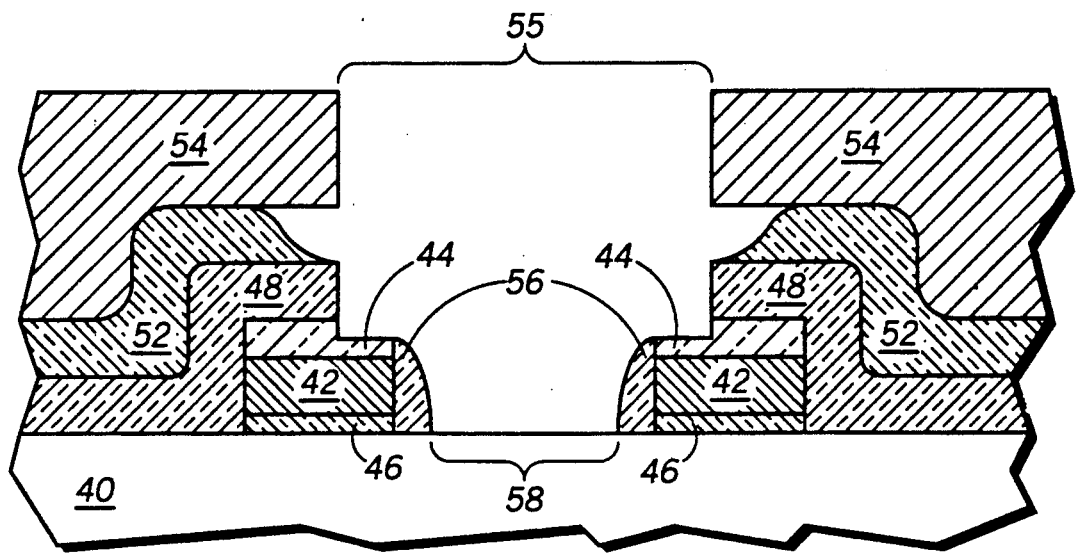

A photoresist layer 54 is deposited onto the device surface, patterned and developed to form a window 55 as illustrated in FIG. 3B. The window 55 may be on the order of 1.0-4.0 μm in width. (Generally, this is larger than the space between conductive members 42 which may range from 0.5-2.0 μm). In the present invention, the device is subjected to an etch which preferentially attacks only the portion of the second insulating layer 52 exposed through the window 55 in the photoresist mask, leaving the first insulating layer 48 substantially unaltered. If the second layer 52 is doped while the first layer 48 is not, the selective etch can be achieved quite easily, for instance by use of a downstream plasma etcher. For example, if the first insulating layer is $SiO_2$ and the second insulating layer is BPSG, an etch chemistry of $CF_4$ and $O_2$ will preferentially etch only the BPSG. Wet etch chemistries may also be used, such as a buffered oxide etch which will preferentially etch SOG to $SiO_2$. The object of this etch step is to completely remove all of the second insulating layer 52 material from between the conductive members 42. While the photoresist mask is still in place, the remaining exposed insulating materials are etched such that spacers 56 are formed along the conductive members 42, see FIG. 3C. This may be accomplished with an anisotropic etch. The etch must completely clear any insulating material from a space 58 between the conductive members 42, yet provide isolation between the members and subsequent conductive layers. A portion of the dielectric layer 44 is also etched during the etching of layer 48, however the extent of this etching is controllable. Dielectric layer 44 is included as a "safety layer" to guarantee the conductive members remain isolated after etching operations.

Figure 3D:
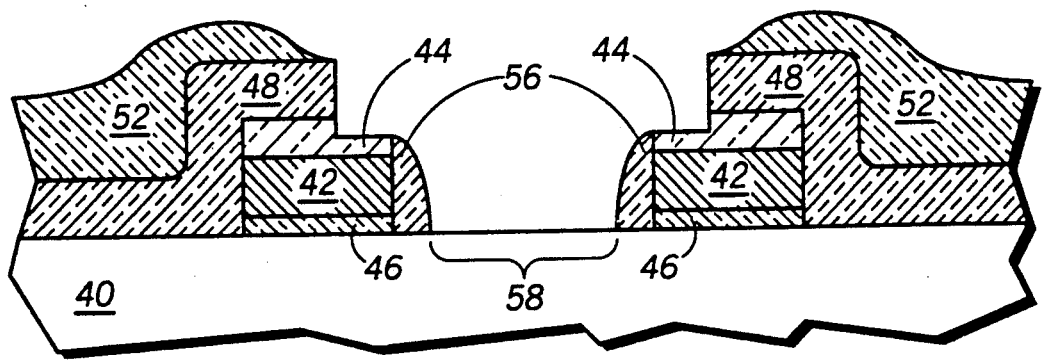
Figure 3E:
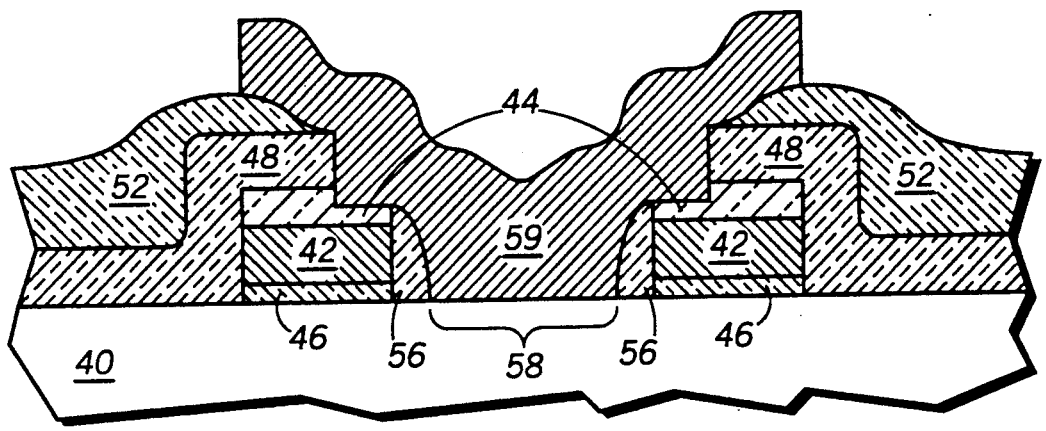

FIG. 3D illustrates what is termed as "selective planarization" in the present invention. Photoresist layer 54 is removed, and the device is heated such that the remaining portions of the second insulating layer 52 flow; however, the remaining portions of the first insulating layer 48 do not. Since only the portions where the second insulating layer remain become planarized, it is referred to as selective planarization. The heating of the second layer can range in temperature from about 400°-1,100° C. and in time from about 0.10-60 minutes, depending on the layer materials chosen. Because space 58 is free of the second insulating layer material, etching to expose the substrate after the heating step is not necessary. Subsequent conductive layers may be deposited and patterned to form contacts to the substrate, such as the contact 59 shown in FIG. 3E. Because areas outside of the contact area have been planarized, the problem of conductive stringers is avoided.

Figure 4A:
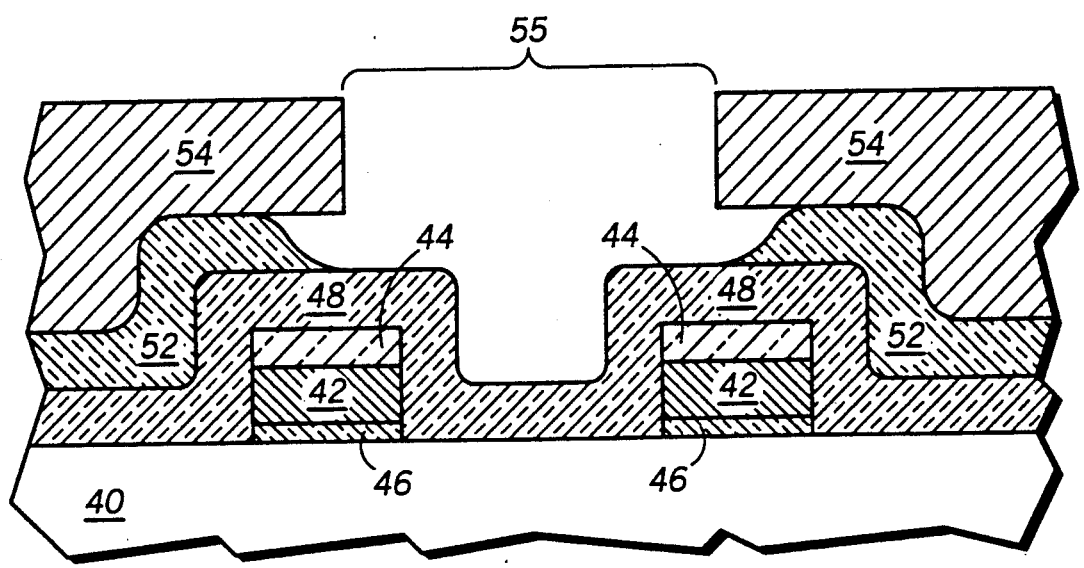
FIGS. 4A–4D: Cross-sectional views of a semiconductor substrate illustrating another embodiment of the disclosed invention.
Figure 4B:
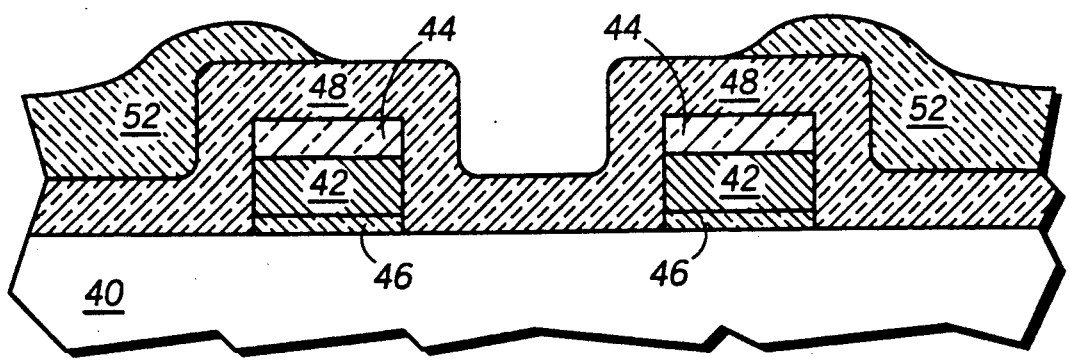
Figure 4C:
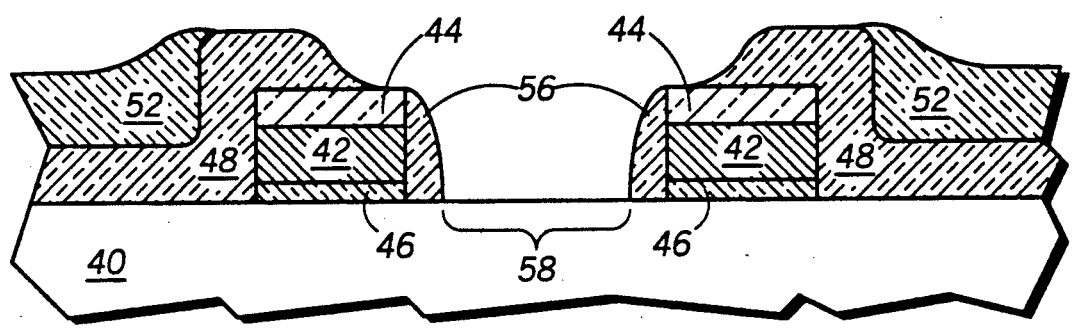
Figure 4D:
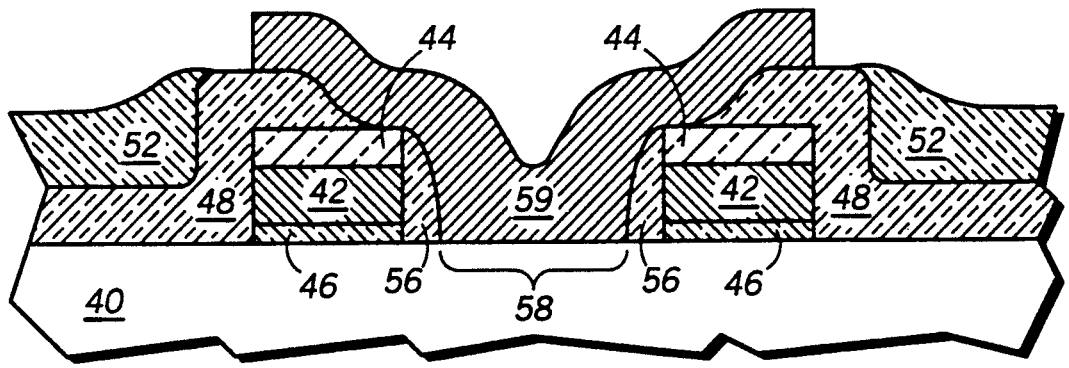

Another embodiment of the present invention is illustrated in FIGS. 4A-4D. The device is processed according to the above description up to and including the point at which the second insulating layer is preferentially removed, see FIG. 4A. However, rather than etching the first insulating layer 48, as in the previous embodiment, the photoresist mask 54 is first removed and the second insulating layer 52 is flowed during a heating operation like that previously described. Flowing the second insulating layer 52 again results in selective planarization, see FIG. 4B, as layer 52 does not exist on all areas of the device at this point. All areas of the device are subsequently exposed to an etch which will form spacers 56 along the conductive members 42 while clearing all insulating material from space 58 and maintaining planarity elsewhere, as illustrated in FIG. 4C. A conductive layer is deposited, patterned and etched to form the contact 59 in FIG. 4D. This embodiment of the invention involves the same steps as the embodiment described previously, merely the sequence of these steps has been changed. Both embodiments provide the ability to form sub-micron, self-aligned contact structures while preventing conductive stringers through the use of selective planarization and are both considered to be within the scope of this invention.

Figure 5A:
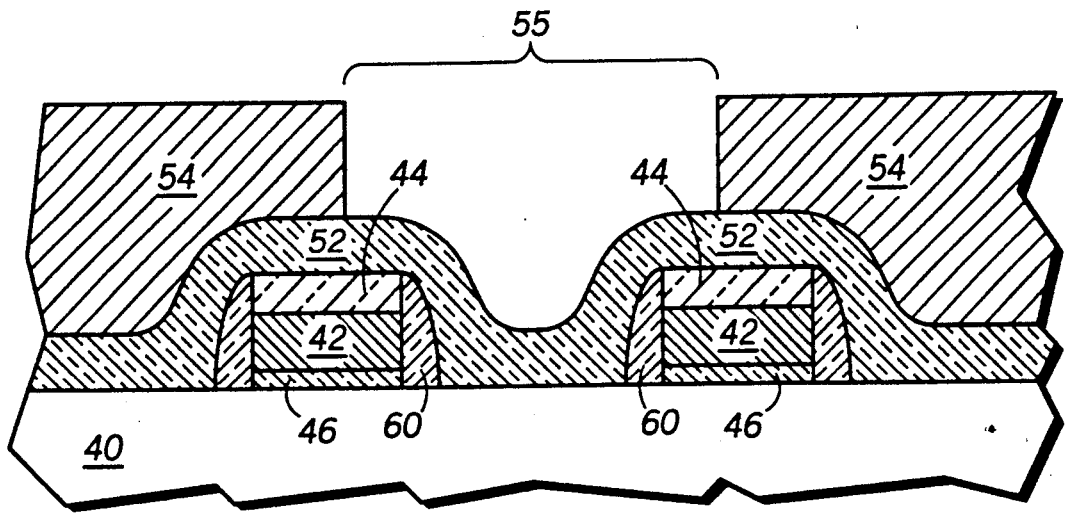
FIGS. 5A–5C: Cross-sectional views of a semiconductor substrate illustrating yet another embodiment of the disclosed invention.
Figure 5B:
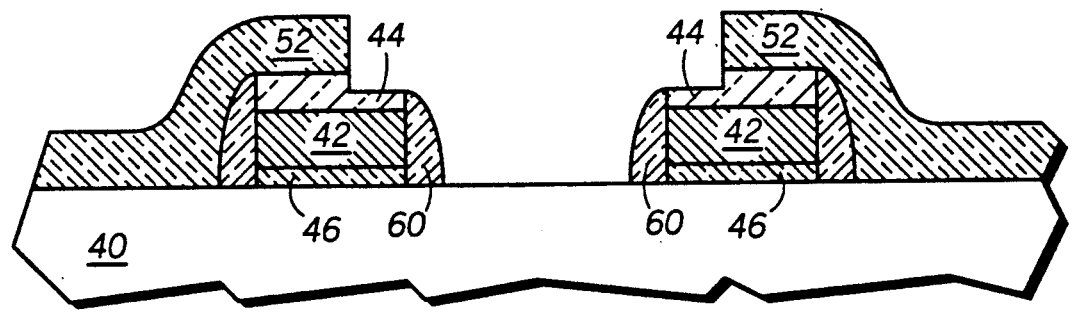
Figure 5C:
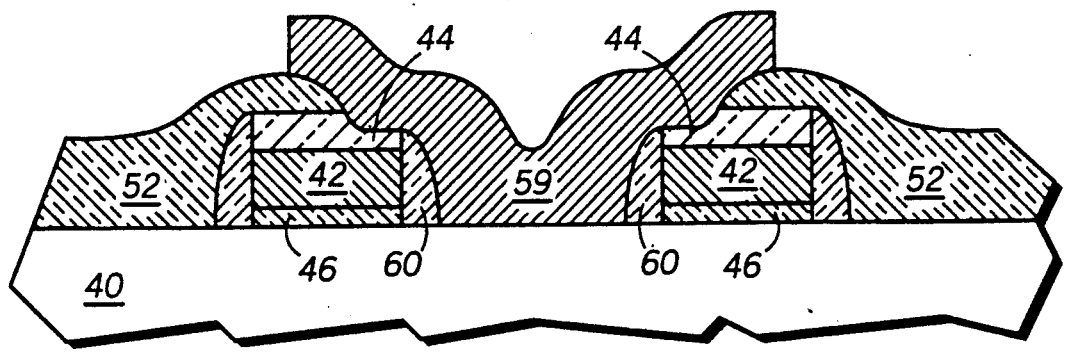

Yet another embodiment of the invention is illustrated in FIGS. 5A-5C. Selective planarization in this embodiment is achieved by forming spacers along both sides of the conductive members with the first insulating layer and depositing a second insulating layer which is subsequently flowed. In FIG. 5A, conductive members 42 with dielectric layer 44 are formed on substrate 40, being separated from the substrate 40 by the gate oxide layer 46. A first insulating layer (not shown) is deposited and etched to form spacers 60 on both sides of the conductive members 42. A second insulating layer 52 is deposited on the substrate 40, conductive members 42 with dielectric layer 44, and spacers 60. A photoresist layer 54 is patterned and developed to form window 55 as in the previous embodiments. As in FIG. 5B, the device is etched in order to expose a portion of the substrate 40 between the conductive members 42. Dielectric layer 44 and spacers 60 are included to assure conductive members 42 remain isolated from any subsequent conductive layers; however during this etch, portions of the dielectric layer 44 and inner spacers 60 may also be etched as illustrated. The amount of etching of these materials can be controlled through proper material selection and etch chemistry. Remaining processing steps are comparable to the previous embodiment of the invention. The remaining portions of the second insulating layer 52 are flowed to provide planarization in selected areas, and a conductive layer is deposited and patterned to form contact 59, as illustrated in FIG. 5C.

Thus it is apparent that there has been provided, in accordance with the invention, a method for fabricating a multi-layer semiconductor device that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the substrate on which the conductive members are formed need not be silicon, but may be another layer of the device, for instance a polysilicon, metal, refractory metal, refractory metal silicide, or selective epitaxial layers. Furthermore, this invention is not limited to use on devices with sub-micron features, but may be used in the fabrication of any semiconductor device. In addition, other insulating layers and methods for depositing, flowing or etching those layers are contemplated within the invention. Therefore, it is intended that this invention encompass all such variations and modifications as fall within the scope of the appended claims.

We claim:

1. A method for fabricating a multi-layer semiconductor device comprising the steps of:

providing a substrate;

forming two conductive members from a first conductive layer on said substrate which are separated by a space having a predetermined width, said conductive members having an overlying dielectric layer which protects and isolates said two conductive members;

depositing a first insulating layer;

depositing a second insulating planarization layer;

patterning said second insulating planarization layer to form an opening in said second insulating planarization layer which is wider than said predetermined width and to remove said second insulating planarization layer from the space between said two conductive members;

etching said first insulating layer to expose an area of said substrate between said conductive members while forming spacers along edges of said conductive members, said spacers and said overlying dielectric layer preventing said two conductive members from being exposed during the etch;

depositing a second conductive layer into said space to contact said substrate; and patterning said second conductive layer to form a contact to said substrate.

2. The method for fabricating a multi-layer semiconductor device of claim 1 wherein said steps of forming said conductive members and depositing a second conductive layer further comprise selecting the conductive materials from the group consisting of polysilicon, metals, refractory metals, refractory metal silicides, and selective epitaxial films.

3. The method for fabricating a multi-layer semiconductor device of claim 1 wherein said steps of depositing said first insulating layer and depositing said second insulating planarization layer comprise selecting said first insulating layer from the group consisting of $SiO_2$ and $Si_3N_4$ and selecting said second insulating planarization layer from the group consisting of SOG, PSG, BPSG, and doped $SiO_2$.

4. The method for fabricating a multi-layer semiconductor device of claim 1 wherein said step of depositing said first insulating layer further comprises depositing said first insulating layer such that said first insulating layer substantially conforms to the underlying topography of said substrate material.

5. The method for fabricating a multi-layer semiconductor device of claim 1 wherein said step of depositing said second insulating planarization layer further comprises depositing said second insulating planarization layer such that said second insulating planarization layer substantially conforms to the underlying topography of said first insulating layer.

6. A method for fabricating a multi-layer semiconductor device comprising the steps of:
providing a substrate;
depositing a first conductive layer;
depositing a dielectric layer;
patterning said first conductive layer and said dielectric layer to form two conductive members on said substrate and which are separated by a space having a predetermined width, said conductive members having an overlying dielectric layer;
conformally depositing a first insulating layer overlying said two conductive members and said overlying dielectric layer;
depositing a second layer of insulating planarization material which substantially conforms to said first insulating layer;
patterning said second layer to form an opening in said second layer which is wider than said predetermined width of said space between said two conductive members and to remove said second layer from between said two conductive members while leaving said second layer in regions outside said two conductive members;
anisotropically etching said first insulating layer to expose an area of said substrate between said conductive members while forming spacers along the edges of said conductive members, said spacers and said overlying dielectric layer preventing said two conductive members from being exposed during the anisotropic etch;
heating the remainder of said second layer sufficiently to flow said remainder, thereby reducing the conformity of said second layer outside said two conductive members and maintaining the profile between said two conductive members;
depositing a second conductive layer such that said second conductive layer extends between conductive members, making contact to said substrate; and
patterning said second conductive layer to form a contact.

7. The method for fabricating a multi-layer semiconductor device of claim 6 wherein said step of depositing a second layer of insulating planarization material comprises depositing a second layer of insulating planarization material over said first insulating layer and spacers formed therefrom.

8. The method for fabricating a multi-layer semiconductor device of claim 6 wherein said step of heating said second layer further comprises heating said second layer to a temperature in the range of 400°–1,100° C. for a period of time in the range of 0.10–60 minutes.

9. The method for fabricating a multi-layer semiconductor device of claim 6 wherein said step of patterning said second layer further comprises patterning said second layer using a downstream etcher.

10. The method for fabricating a multi-layer semiconductor device of claim 6 wherein said step of patterning said first conductive layer and said dielectric layer to form two conductive members comprises patterning said first conductive layer and said dielectric layer to form two conductive members which are separated by a space having a width substantially in the range of 0.5–2.0μ.

11. The method for fabricating a multi-layer semiconductor device of claim 6 wherein said step of depositing a first insulating layer and depositing a second layer of insulating planarization material further comprise depositing said layers with thicknesses substantially in the range of 500–4,000 Å.

12. The method for fabricating a multi-layer semiconductor device of claim 11 wherein said step of depositing a second layer comprises depositing a second layer of doped insulating planarization material.

13. A method for fabricating a multi-layer semiconductor device comprising the steps of:
providing a substrate;
depositing a first conductive layer;
depositing a dielectric layer overlying the first conductive layer;
patterning said first conductive layer and said dielectric layer to form two conductive members on said substrate and which are separated by a space having a predetermined width, said conductive members maintaining the overlying dielectric layer;
conformally depositing a first insulating layer overlying said two conductive members and said overlying dielectric layer;
depositing a second layer of insulating planarization material over the first insulating layer and substantially conforming to said first insulating layer, the first and second layers having substantially equal thicknesses;
patterning said second layer to form an opening in said second layer which is wider than said predetermined width of said space between said two conductive members and to remove said second layer from between said two conductive members while leaving said second layer in regions outside said two conductive members;
etching said first insulating layer to expose an area of said substrate between said conductive members while forming spacers along the edges of said conductive members, said spacers and said overlying dielectric layer preventing said two conductive members from being exposed during the etch;

heating the remainder of said second layer sufficiently to flow said remainder, thereby reducing the conformity of said second layer outside said two conductive members and maintaining the profile between said two conductive members;

depositing a second conductive layer such that said second conductive layer extends between said conductive members, making contact to said substrate; and patterning said second conductive layer to form a contact.

* * * * *